United States Patent [19]

Haisma et al.

[11] Patent Number: 5,009,689
[45] Date of Patent: Apr. 23, 1991

[54] METHOD OF MANUFACTURING A SEMICONDUCTOR DEVICE

[75] Inventors: Jan Haisma; Cornelis L. Alting; Theodorus M. Michielsen, all of Eindhoven, Netherlands

[73] Assignee: U.S. Philips Corporation, New York, N.Y.

[21] Appl. No.: 7,153

[22] Filed: Jan. 27, 1987

[30] Foreign Application Priority Data

Jan. 30, 1986 [NL] Netherlands .......................... 8600216

[51] Int. Cl.$^5$ ...................... H01L 21/00; C03B 29/00
[52] U.S. Cl. .......................................... 65/33; 65/40; 65/43; 65/60.5; 65/63; 65/111; 65/120; 65/155
[58] Field of Search .................... 65/17, 36, 40, 42, 43, 65/33, 60.5, 63, 111, 120, 155

[56] References Cited

U.S. PATENT DOCUMENTS

| | | | |
|---|---|---|---|
| 3,217,088 | 11/1965 | Steierman | 65/40 |
| 3,397,278 | 8/1968 | Pomerantz | 65/40 |
| 4,146,380 | 3/1979 | Caffarella et al. | 65/155 |
| 4,328,022 | 5/1982 | Bonk et al. | 65/43 |
| 4,501,060 | 2/1985 | Frye et al. | 65/40 |
| 4,685,200 | 8/1987 | Bokil | 65/43 |

FOREIGN PATENT DOCUMENTS

| | | | |
|---|---|---|---|
| 0136050 | 3/1985 | European Pat. Off. | |
| 0100145 | 6/1985 | Japan | 65/155 |
| 1193136 | 11/1985 | U.S.S.R. | 65/43 |

OTHER PUBLICATIONS

Lasky et al., Silcon on Insulator (50I) by Bonding and Etch Back, IEEE Conf. 1985.

Primary Examiner—David A. Simmons
Assistant Examiner—Thi Dang
Attorney, Agent, or Firm—Paul R. Miller

[57] ABSTRACT

In a method of manufacturing a semiconductor device, at least a support body (1) and a monocrystalline semiconductor body (2) are provided with at least one flat optically smooth surface obtained by means of bulk-reducing polishing (mirror polishing), while at least the semiconductor body is provided at the optically smooth surface with an oxide layer (3). The two bodies (1 and 2) are brought into contact with each other in a dust-free atmosphere after their flat surfaces have been cleaned in order to obtain a mechanical connection. Before the bodies are brought into contact with each other, at least the oxide layer (3) on the semiconductor body (2) is subjected to a bonding-activating operation, while after a connection has been formed between the surfaces, radiation (5) of a laser is focused on the connection surface of the two bodies and material of at least the semiconductor body is molten locally near the connection surface by means of the laser radiation. After solidification, a locally fused connection has been established between the two bodies. The semiconductor body (2) is formed from a material admitting a sufficient oxygen diffusion.

8 Claims, 1 Drawing Sheet

METHOD OF MANUFACTURING A SEMICONDUCTOR DEVICE

The invention relates to a method of manufacturing a semiconductor device comprising at least a support body with and a monocrystalline semiconductor body, both bodies being provided with at least one flat optically smooth surface obtained by means of bulk-reducing polishing (mirror polishing), while at least the semiconductor body has at the optically smooth surface an oxide layer and with these two bodies being brought into contact with each other in a dust-free atmosphere after their flat surfaces have been cleaned in order to obtain a mechanical connection. Such a device is known from EP No. 136,050.

In the technique for connecting the two bodies known from EP No. 136,050, which is designated as wringing, a heat treatment above 300° C., preferably between 600° C. and 1250° C., is carried out in order to obtain a permanently firm connection. However, conditions may occur which make it undesirable to subject the semiconductor body to such a high temperature, for example, when structures not capable of withstanding such a heat treatment have already been provided in the semiconductor body.

The invention has for its object to obtain with the wringing technique a permanently firm connection between the bodies without it being necessary to carry out an integral heat treatment at comparatively high temperatures. This object is achieved with the method mentioned in the opening paragraph, which is characterized in that, before the bodies are brought into contact with each other, at least the oxide layer on the semiconductor body is subjected to a bonding-activating treatment, in that then a connection between the surfaces is established, in that subsequently radiation of a laser is focused on the connection surface of the two bodies, and in that material of at least the semiconductor body is molten locally at the connection surface by the laser radiation with a fused connection being formed after solidification between the two bodies, the semiconductor body consisting of a material admitting a sufficient oxygen diffusion.

The locally strong heating by means of the focused laser radiation leads to the expectation that the wringing connection will be loosened due to local expansion of material or that rupture will occur due to the very locally occurring stress, for example, at crystallographic cleavage surfaces of the monocrystalline semiconductor body. However, it has surprisingly been found that with a material admitting a sufficient oxygen diffusion, a stress equalization via oxygen diffusion occurs so that loosening of the van der Waals connection and rupture of the monocrystalline semiconductor material do not occur. Thus, a fused connection is obtained locally between the wrung bodies without an integral heat treatment at high temperatures being necessary.

Preferably, the semiconductor body consists of silicon and the oxide layer is formed from a silicon oxide that may be stoichiometric.

This embodiment and further embodiments of the invention will be described with reference to the drawing.

DETAILED DESCRIPTION OF THE SPECIFIC EMBODIMENTS

Figure 1:
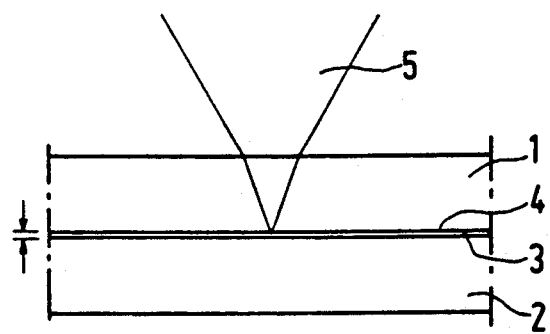
FIG. 1 shows a first embodiment of the bodies to be connected to each other.

FIG. 1 shows a first example of obtaining a semiconductor device according to the invention. A support body 1 consists of a material transparent to radiation of an argon ion laser, such as quartz glass. A semiconductor body 2 may be formed from silicon, on which is disposed a thin layer 3 of naturally grown silicon oxide. The layer 3 has a thickness of, for example, 5 nm (50 Å). The surfaces to be interconnected of the two bodies are flattened and smoothed by means of a mirror polishing treatment. During such a polishing treatment, at least 10 $\mu$m of material is removed. After the oxide has grown, the oxide layer 3 of the semiconductor layer 2 is subjected to a bonding-activating treatment. This operation ensures that atoms at the surface of the layer are additionally bonded. The bonding-activating treatment may consist, for example, in a light etching of the surface layer. Another possibility consists in that a surface smoothing treatment is carried out, in which mainly microscopic unevennesses are smoothed.

After having been cleaned, the two bodies are positioned against each other in a dust-free atmosphere in such a manner that the layer 3 of the semiconductor body is disposed against the surface 4 of the support body. A spontaneous adhesion then takes place, which is known under the designation "wringing". Due to the bonding points in the surface of layer 3 as a result of the bonding activating treatment, the adhesion is strong in this case. At least 50% of the optically smooth surfaces are then subjected to a van der Waals bonding.

It has been found in practice that this connection is not always permanent. A local heating may cause the surfaces to be loosened, while upon immersion in a thin liquid, such as ethanol, a slow penetration of the liquid between the wrung surfaces may give rise to loosening. An integral heat treatment at a high temperature results, however, in a constant adhering effect throughout the surface. However, if the bodies to be interconnected must not be subjected integrally to a high temperature, a solution has to be found to obtain a permanent adhesion under all circumstances. This can be locally effected by point fusion or line fusion of the two wrung surfaces by means of the method according to the invention.

FIG. 1 shows radiation of a laser, which radiation is focused on the connection surface of the bodies 1 and 2. The laser not shown is in this embodiment an argon ion laser, which emits radiation in the visible part of the frequency spectrum to which the quartz glass body 1 is transparent. The region of the radiation is designated by reference numeral 5. The laser radiation locally heats the silicon at the connection surface over a region of about 5 $\mu$m, the temperature in situ increasing to 1405° C. or more so that the silicon melts. It has been found that the diffusion of oxygen is high in the molten silicon. As a result, oxygen can diffuse from the silicon oxide layer into the molten silicon; the diffusion takes place in a zone having a size of about 20 μm with the focused laser radiation being the center of this zone. This diffusion results in a stress equalization in the region onto which the laser radiation is directed so that in spite of the locally very high temperature the bodies 1 and 2 are prevented from being loosened or rupture of the bodies is avoided.

Figure 2:
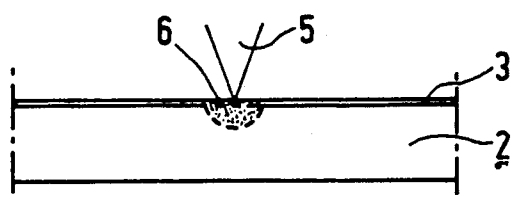
FIG. 2 shows the semiconductor body with the zone in which oxygen diffusion occurs.

In FIG. 2, there is indicated in the semiconductor body 2 the zone 6 within which oxygen diffuses into the silicon. This diffusion effect can be shown by means of a transmission electron microscope.

Figure 3:
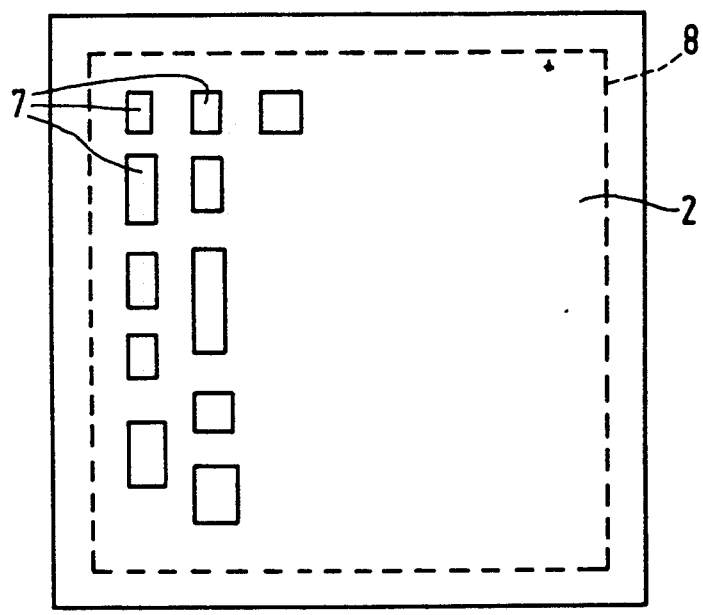
FIG. 3 shows a sealed connection in a semiconductor body already provided with structures, such as integrated circuits.

FIG. 3 shows a form of fused connection, in which also a vacuum seal is provided between the bodies to be interconnected. In the semiconductor body 2 are provided structures 7, i.e. combinations of electronic elements provided in the silicon by means of known semiconductor techniques. After wringing of the bodies to be interconnected, silicon is molten along the dotted line 8 by means of an argon ion laser. After solidification, a permanent fused connection is obtained between the bodies, which acts at the same time as a vacuum seal. By fusion of the two bodies and stress equalization by oxygen diffusion into the molten silicon, the bodies are prevented from being loosened.

In the embodiment described, silicon is molten, into which oxygen is diffused. Other suitable materials may also be used provided that the oxygen diffusion is sufficiently high.

Figure 4:
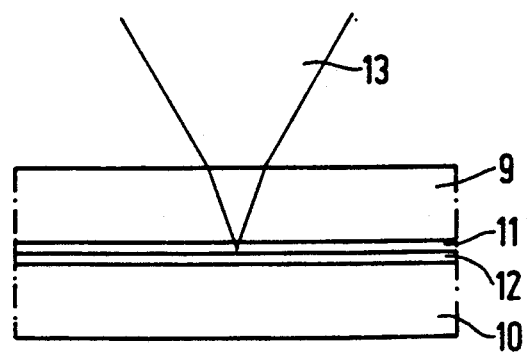
FIG. 4 shows a second embodiment of bodies to be connected to each other.

FIG. 4 shows an example of connecting two silicon slices 9 and 10 to each other, which are each provided with a layer 11, 12 of silicon oxide having a thickness of, for example, 1 μm. Use is then made of a $CO_2$ laser providing a region of radiation 13. On behalf of a good focusing, the outer major surface of the silicon slice 9 is polished. The $CO_2$ laser produces a radiation of 10.6 μm. Undoped or low-doped silicon is transparent to radiation of this wavelength. On the contrary, silicon oxide absorbs this radiation. When the laser radiation is focused on the wrung silicon oxide intermediate layers 11 and 12, fusion of the, as the case may be stoichiometric silicon oxide takes place in situ. Also in this case, the wrung connection is not loosened and rupture does not occur along crystallographic cleavage surfaces of the monocrystalline semiconductor materials. Silicon near the fused silicon oxide reaches a sufficiently high temperature to permit oxygen diffusion and thus to bring about a stress equalization. X-ray topographically, the fused connection can be shown distinctly as a result of a lattice disorder in the monocrystalline silicon locally above and below the connection.

The wrung silicon oxide layers have to be sufficiently thick to yield a sufficient absorbing power for the laser radiation, on the one hand, for obtaining a sufficiently high fusion temperature and, on the other hand, for heating adjacent silicon in order to bring about a stress equalization via oxygen diffusion. The thinner the layers, the higher has to be the required laser power. A lower limit forms the natural oxide on silicon and the upper limit may lie, for example, at 25 μm. The two oxide layers need not be of the same thickness.

What is claimed is:

1. A method of manufacturing a semiconductor device comprising the steps of
    providing each of a support body and a monocrystalline semiconductor body with an optically smooth surface by a step of bulk-reducing polishing, said monocrystalline semiconductor body consisting of a material having sufficient oxygen diffusion,
    providing an oxide layer at the optically smooth surface of at least said semiconductor body,
    subjecting at least said oxide layer to a bonding-activating operation,
    then mechanically contacting said support body and said oxide layer on said semiconductor body at said optically smooth surface of each to provide a contact surface, said contacting step being carried out in a dust-free atmosphere, and said contacting step being carried out after cleaning said surface of each,
    focussing laser radiation on at least a part of said contact surface through said support body, said support body being transparent to said laser radiation,
    locally melting at least point portions, each portion being over a region of about 5 μm of said semiconductor body, at said contact surface by said laser radiation, and
    forming locally fused connections between said support body and said semiconductor body by diffusing oxygen from said oxide layer into said semiconductor body and by then solidifying said melted portions.

2. A method according to claim 1, wherein said semiconductor body is silicon, and said oxide layer is silicon oxide.

3. A method according to claim 2, wherein said support body is formed from quartz glass, wherein said laser radiation is provided from an argon ion laser, and wherein said laser radiation is directed through said quartz glass onto said contact surface.

4. A method according to claim 1 or claim 2, wherein both said support body and said monocrystalline semiconductor body are formed of silicon, and said oxide layer is formed on both said support body and said semiconductor body, said oxide layer being silicon oxide, and wherein said laser radiation is provided from a $CO_2$ laser focussed onto said silicon oxide on both said support body and said semiconductor body, said locally fused connections being established in said silicon oxide layers.

5. A method according to claim 4, wherein said silicon oxide layers have such a thickness to provide together a sufficient heat-absorbing power for said laser radiation to obtain local fusion, and wherein said heat-absorbing power heats adjacent silicon to a temperature that stress equalization occurs by oxygen diffusion.

6. A method according to claim 1, wherein said bonding-activating operation includes the step of lightly etching said oxide layer.

7. A method according to claim 1, wherein said bonding-activating operation includes the step of carrying out surface smoothing to smooth microscopic unevenness.

8. A method according to claim 1, wherein during said step of locally melting, said oxygen from said oxide layer diffuses into said semiconductor body to cause stress equalization in said portions of said semiconductor body, said stress equalization preventing loosening or rupture of joined portions of said support body and said semiconductor body.

* * * * *